US 6,648,966 B2

(12) United States Patent
Maruska et al.

(10) Patent No.: US 6,648,966 B2
(45) Date of Patent: Nov. 18, 2003

(54) WAFER PRODUCED THEREBY, AND ASSOCIATED METHODS AND DEVICES USING THE WAFER

(75) Inventors: Herbert Paul Maruska, Winter Springs, FL (US); John Joseph Gallagher, Winter Park, FL (US); Mitch M. C. Chou, Sanford, FL (US)

(73) Assignee: Crystal Photonics, Incorporated, Sanford, FL (US)

( * ) Notice: Subject to any disclaimer, the term of this patent is extended or adjusted under 35 U.S.C. 154(b) by 0 days.

(21) Appl. No.: 09/920,448

(22) Filed: Aug. 1, 2001

(65) Prior Publication Data

US 2003/0024472 A1 Feb. 6, 2003

(51) Int. Cl.[7] .............................................. C30B 25/18

(52) U.S. Cl. .......................... 117/101; 117/94; 117/95; 117/105; 117/910; 117/952

(58) Field of Search ................. 117/101, 105, 117/94, 95, 910, 952

(56) References Cited

U.S. PATENT DOCUMENTS

| 5,625,202 | A |   | 4/1997  | Chai ............................ 257/94 |
| 5,679,152 | A |   | 10/1997 | Tischler et al. ................ 117/97 |
| 5,874,747 | A |   | 2/1999  | Redwing et al. ............... 257/74 |
| 5,917,196 | A |   | 6/1999  | Teraguchi ..................... 257/22 |
| 6,086,673 | A |   | 7/2000  | Molnar ......................... 117/90 |
| 6,139,628 | A |   | 10/2000 | Yuri ............................. 117/89 |
| 6,146,457 | A | * | 11/2000 | Solomon ...................... 117/90 |
| 6,146,458 | A |   | 11/2000 | Hooper et al. ............... 117/106 |
| 6,156,581 | A |   | 12/2000 | Vaudo et al. .................. 438/22 |
| 6,218,280 | B1 |  | 4/2001  | Kryliouk et al. ............. 438/607 |
| 6,252,261 | B1 |  | 6/2001  | Usui et al. ................... 257/190 |
| 6,447,604 | B1 | * | 9/2002  | Flynn et al. .................. 117/89 |

FOREIGN PATENT DOCUMENTS

| JP | 10-215028 A | * | 10/1998 |
| WO | 01/35447 |   | 5/2001 |

OTHER PUBLICATIONS

Maruska et al., *Applied Physics Letters*, "The Preparation and Properties of Vapor–Deposited Single–Crystal–Line GaN", vol. 15, No. 10 (Nov. 15, 1969) pp. 327–329.

Deschler et al., *Journal of Crystal Growth*, "Halogen VPE of AlGaAs for Optoelectronic Device Applications", vol. 82 (1987) pp. 628–638.

Safvi et al., *Mat. Res. Soc. Symp. Proc.*, "Optimization of Reactor Geometry and Growth Conditions for GaN Halide Vapor Phase Epitaxy", vol. 423 (1996) pp. 226–244.

Sun et al., *Applied Physics Letters*, "Comparison of the Physical Properties of GaN Thin Film Deposited on (0001) and (0112) Sapphire Substrates", vol. 63, No. 7 (Aug. 16, 1993) pp. 973–975.

(List continued on next page.)

Primary Examiner—Robert Kunemund
(74) Attorney, Agent, or Firm—Allen, Dyer, Doppelt, Milbrath & Gilchrist, P.A.

(57) ABSTRACT

A method for making a free-standing, single crystal, gallium nitride (GaN) wafer includes forming a single crystal GaN layer directly on a single crystal $LiAlO_2$ substrate using a gallium halide reactant gas, and removing the single crystal $LiAlO_2$ substrate from the single crystal GaN layer to make the free-standing, single crystal GaN wafer. Forming the single crystal GaN layer may comprise depositing GaN by vapor phase epitaxy (VPE) using the gallium halide reactant gas and a nitrogen-containing reactant gas. Because gallium halide is used as a reactant gas rather than a metal organic reactant such as trimethygallium (TMG), the growth of the GaN layer can be performed using VPE which provides commercially acceptable rapid growth rates. In addition, the GaN layer is also devoid of carbon throughout. Because the GaN layer produced is high quality single crystal, it may have a defect density of less than about $10^7$ cm$^{-2}$.

62 Claims, 6 Drawing Sheets

OTHER PUBLICATIONS

Sasaki et al., *Journal of Applied Physics*, "Substrate–Orientation Dependence of GaN Single–Crystal Films Grown by Metalorganic Vapor–Phase Epitaxy", vol. 61, No. 7 (Apr. 1, 1987) pp. 2533–2540.

Naniwae et al., *Journal of Crystal Growth*, "Growth of Single Crystal GaN Substrate Using Hybride Vapor Phase Epitaxy", vol. 99 (1990) pp. 381–384.

Hellman et al., *MRS Internet Journal of Nitride Semiconductor Research*, "Epitaxial Growth and Orientation of GaN on (100) g–LiAlO2", vol. 2, Article 30 (Sep. 15, 1997).

Waltereit et al., *NATURE*, "Nitride Semiconductors Free of Electrostatic Fields for Effecient White Light–Emitting Diodes", vol. 406 (Aug. 24, 2000) pp. 865–868.

Kryliouk et al., *Phys. Stat. Sol.*, "GaN Substrates: Growth and Characterization", (Jul. 4, 1999) pp. 407–410.

Ke Xu et al., *Phys. Stat. Sol.*, "MOCVD Growth of GaN on $LiAlO_2(100)$ Substrates", (Jul. 4, 1999) pp. 589–593.

Jin Seo Im et al., *Mat. Res. Soc. Symp. Proc.*, "Effects of Piezoelectric Fields in GaInN/AiGaN Heterostructures and Quantum Wells", vol. 482 (1998) pp. 513–518.

Waltereit et al., *Phys. Stat. Sol.*, "Growth of M–Plane GaN($1100$): A way to Evade Electrical Polarization in Nitrides", (Mar. 6, 2000) pp. 133–138.

Xu Ke et al., *Journal of Crystal Growth*, "$\gamma$–$LiAlO_2$ Single Crystal: A Novel Substrate for GaN Epitaxy", vol. 193 (Apr. 27 1998) pp. 127–132.

P. Waltereit et al., *Journal of Crystal Growth*, Growth of M–plane GaN ($1100$) on y–$LiAlO_2$ ($100$), p. 143–147.

\* cited by examiner

WAFER PRODUCED THEREBY, AND ASSOCIATED METHODS AND DEVICES USING THE WAFER

FIELD OF THE INVENTION

The invention relates to the field of semiconductors, and, more particularly, to methods for making single crystal wafers and the wafers produced thereby.

BACKGROUND OF THE INVENTION

Gallium nitride (GaN) is a highly desirable material for making many types of electronic devices. GaN has a wide bandgap of about 3.4 eV and is a direct-transistion type of semiconductor, and is thus attractive for light-emitting devices. It also has a high breakdown voltage, good transport properties and the ability to form high quality heterostructures. Accordingly, GaN is also attractive for high power, high temperature applications, such as high power amplifiers.

The desirable starting material for a GaN-based device would preferably be a bulk crystal or wafer form of GaN, on which various doped layers could be epitaxially grown. Unfortunately, GaN in wafer form is not producible using conventional melt pulling crystal growth techniques, as are silicon wafers, for example. Accordingly, approaches have been pursued for producing single crystal GaN films on growth substrates which remain attached to the GaN film to further serve as support or which are later removed.

For example, U.S. Pat. No. 5,625,202 to Chai discloses forming GaN on various substrate materials to produce light emitting devices. These substrate materials are described as modified wurtzite structure oxide compounds and include Lithium Aluminum Oxide, Sodium Aluminum Oxide, Lithium Gallium Oxide, Sodium Gallium Oxide, Lithium Germanium Oxide, Sodium Germanium Oxide, Lithium Silicon Oxide, Silicon Oxide, Lithium Phosphor Oxide, Lithium Arsenic Oxide, Lithium Vanadium Oxide, Lithium Magnesium Germanium Oxide, Lithium Zinc Germanium Oxide, Lithium Cadmium Germanium Oxide, Lithium Magnesium Silicon Oxide, Lithium Zinc Silicon Oxide, Lithium Cadmium Silicon Oxide, Sodium Magnesium Germanium Oxide, Sodium Zinc Germanium Oxide, and Sodium Zinc Silicon Oxide. The GaN layer remains on the growth substrate.

U.S. Pat. No. 6,156,581 to Vaudo et al. discloses growing one of a gallium, aluminum, or indium (Ga, Al, In) nitride layer on a substrate for subsequent fabrication, by metalorganic chemical vapor deposition (MOCVD) or molecular beam epitaxy (MBE) of a microelectronic device thereon. Vapor-phase (Ga, Al, In) chloride is reacted with a vapor-phase nitrogenous compound in the presence of a substrate to form (Ga, Al, In) nitride. The thickness of the base layer may be on the order of 2 microns and greater, and the defect density may be on the order of $10^8$ cm$^{-2}$ or lower. The patent provides a laundry list of proposed foreign substrates including sapphire, silicon, silicon carbide, diamond, lithium gallate, lithium aluminate, zinc oxide, spinel, magnesium oxide, ScAlMgO4, gallium arsenide, silicon-on-insulator, carbonized silicon-on-insulator, carbonized silicon-on-silicon, gallium nitride, etc., including conductive as well as insulating and semi-insulating substrates, twist-bonded substrates (i.e., where the substrate of crystalline material is bonded to another single crystal substrate material with a finite angular crystallographic misalignment), and compliant substrates of the type disclosed in U.S. Pat. No. 5,563,428 to Ek et al., etc. The patent further discloses that in some embodiments, the substrate can be removed leaving a free-standing wafer. Unfortunately, the patent provides specific growth information only for sapphire.

U.S. Pat. No. 6,139,628 to Yuri et al. discloses forming GaN on sapphire by first heating the substrate in gas atmosphere including gallium, forming a first gallium nitride on the substrate, and forming a second gallium nitride on the first gallium nitride at a higher temperature than the temperature when the first gallium nitride was formed. A product of the gas including mono-atomic metal gallium is bonded to the surface of the substrate homogeneously and in a high density by applying heat to the substrate in the gas atmosphere including gallium. The first gallium nitride is formed at the low temperature by using the bonded metal gallium so that gallium nitride can complete its initial growth flat and homogeneously without re-vaporization. Further, after forming the first gallium nitride, the second gallium nitride is formed at the higher temperature, whereby the crystallinity of not only the first gallium nitride but also the second gallium nitride are improved through the heat treatment with the high temperature. After the third step is completed, the substrate may be removed.

A number of other approaches have also formed pretreatment layers prior to GaN deposition. For example, U.S. Pat. No. 6,086,673 to Molnar discloses forming a zinc oxide pretreatment layer on sapphire and then subjected to a gaseous environment including HCl and/or NH3 containing gas, that is thermochemically reactive with the zinc oxide. An epitaxial layer of GaN can be grown on the pretreated substrate.

Along these lines, U.S. Pat. No. 6,218,280 B1 to Kryliouk et al. discloses forming a nitrided layer on a lithium gallate substrate, forming a first GaN layer on the nitrided layer by metalorganic chemical vapor deposition (MOCVD), growing a next GaN portion using halide vapor phase epitaxy, and growing a capping GaN layer again using MOCVD. The GaN layers may then be separated from the substrate. The patent lists a number of other proposed substrates in addition to the specifically disclosed lithium gallate. These other substrates include $LiAlO_2$, $MgAlScO_4$, $Al2MgO_4$ and $LiNdO_2$. Unfortunately, the use of MOCVD results in carbon being incorporated into the GaN wafer. This carbon may be undesirable for many applications where pure GaN is desired.

An article by Naniwae et al. entitled "Growth of Single Crystal GaN substrate Using Hydride Vapor Phase Epitaxy" in Jnl of Crystal Growth, Vol. 99, 1990, pp. 381–384, discloses growth of GaN films on a sapphire substrate. A pretreatment of gallium and HCl without ammonia for 10–20 minutes at 1030° C. is used to pretreat the sapphire surface prior to metalorganic vapor phase epitaxy (MOVPE) of the GaN film.

An article by Xu et al. entitled "γ-$LiAlO_2$ single crystal: a novel substrate for GaN epitaxy" in the Journal of Crystal Growth, Vol. 193, 1998, pp. 127–132, discloses $LiAlO_2$ as a substrate for GaN film growth. The substrates were pretreated with ammonia, and thereafter the GaN film was grown using metalorganic chemical vapor deposition. Another article by Xu et al. entitled "MOCVD Growth of GaN on $LiAlO_2$ Substrates" in Phys. Stat. Sol. (a) Vol. 176 (1999), pp. 589–593 also discloses an $LiAlO_2$ substrate, an ammonia pretreatment, and MOCVD to form the GaN layer. Unfortunately, the MOCVD process may not be sufficiently fast to produce thicker films. In addition, the precursor gas for deposition is trimethylgallium which results in carbon being undesirably incorporated into the GaN layer.

An article by Waltereit et al. entitled "Nitride semiconductors free of electrostatic fields for efficient white light-emitting diodes" in Letters to Nature, Vol. 406, Aug. 24, 2000, pp. 865–868, discloses the epitaxial growth of a thin layer of M-plane GaN on γ-LiAlO$_2$ using plasma-assisted molecular beam epitaxy. The exposed surface of the thin GaN layer may be bonded to another substrate and the LiAlO$_2$ layer then selectively removed to form certain types of higher efficiency devices.

An article also by Waltereit et al. entitled "Growth of M-Plane GaN(1$\bar{1}$00): A Way to Evade Electrical Polarization in Nitrides" in Phys. Stat. Sol. (a) Vol. 180 (2000) pp. 133–138, similarly discloses the formation of an M-plane GaN layer on LiAlO$_2$ substrate. The thin GaN layer (1.5 μm sample) is grown using molecular beam epitaxy at a relatively slow growth rate of 0.5 μm/h. The article reports that M-plane GaN is free of electrical polarization, as compared to more convention C-plane GaN, and that this leads to improved electron-hole wavefunction overlap and therefore improved quantum efficiencies. The M-plane GaN quantum wells have a dramatic improvement in room-temperature quantum efficiency, and the authors surmise that if contributions from competing non-radiative recombination channels are equal for M-plane and C-plane wells, then M-plane GaN opens the way for highly efficient ultraviolet emission.

Despite continuing developments in the area of GaN film growth, what would still be desired is an efficient approach to produce free-standing, high quality, single crystal, GaN wafers for use in subsequent device fabrication.

SUMMARY OF THE INVENTION

In view of the foregoing background, it is therefore an object of the present invention to provide a method for making high-quality, free-standing, single crystal GaN wafers for use in electronic devices.

This and other objects, features and advantages in accordance with the present invention are provided by a method for making a free-standing, single crystal, gallium nitride (GaN) wafer comprising forming a single crystal GaN layer directly on a single crystal LiAlO$_2$ substrate using a gallium halide reactant gas, and removing the single crystal LiAlO$_2$ substrate from the single crystal GaN layer to make the free-standing, single crystal GaN wafer.

Forming the single crystal GaN layer may comprise depositing GaN by vapor phase epitaxy (VPE) using the gallium halide reactant gas and a nitrogen-containing reactant gas. For example, the gallium halide reactant gas may comprise gallium chloride, and the nitrogen-containing reactant gas may comprise ammonia.

Because gallium halide is used as a reactant gas rather than a metal organic reactant, such as trimethygallium (TMG), the growth of the GaN layer can be performed using VPE which provides commercially acceptable rapid growth rates. In addition, the GaN layer is also devoid of carbon throughout. Because the GaN layer produced is high quality single crystal, it may have a defect density of less than about 10$^7$ cm$^{-2}$. Its major surface opposite the LiAlO$_2$ substrate is also relatively smooth, such as having a surface roughness of less than about 5 nm RMS. Accordingly, the upper surface does not need a smoothing capping layer, such as also typically formed using a metal organic, such as TMG. Considered in somewhat different terms, the method may be considered as forming a single crystal GaN layer devoid of carbon directly on the single crystal LiAlO$_2$ substrate.

Another aspect of the invention relates to pretreating the single crystal LiAlO$_2$ substrate prior to depositing GaN which may enhance the quality of the GaN single crystal layer. More particularly, the pretreating may use the gallium halide reactant gas without the nitrogen-containing reactant gas. The pretreating may be performed for a time sufficient to form a monolayer of gallium on the single crystal LiAlO$_2$ substrate. The pretreating and depositing may also be performed in the same chamber. Of course, the LiAlO$_2$ substrate may be cleaned prior to forming the GaN layer.

The method may be advantageously used to produce a (1$\bar{1}$00)-oriented GaN wafer. Such a wafer offers advantages in terms of efficiency and producing UV spectrum light emitting devices. The (1$\bar{1}$00)-oriented GaN layer may be grown by using (100)-oriented tetragonal (γ) LiAlO$_2$ as the starting substrate material.

An advantage of the LiAlO$_2$ substrate is that it may be considered a compliant substrate, unlike sapphire, for example, that tends to cause wafers to take a bowed shape. Moreover, the method may include forming the GaN layer at an elevated temperature, and with the LiAlO$_2$ substrate and the GaN layer having relative thicknesses so that the LiAlO$_2$ substrate develops cracks therein upon cooling from the elevated temperature. These cracks may be advantageous for a subsequent wet etching step to remove the LiAlO$_2$ substrate. The wet etching may comprise wet etching using hydrochloric acid at a temperature above room temperature.

The method may include the use of an LiAlO$_2$ substrate having a diameter of 50 mm or greater so that the single crystal GaN wafers have a corresponding relatively large diameter. The GaN layer may also be grown to have a thickness of greater than about 100 μm.

Another aspect of the invention relates to a free-standing, single crystal GaN wafer having characteristics different than prior art GaN wafers. More particularly, the GaN wafer may comprise (1$\bar{1}$00)-oriented, single crystal GaN which is devoid of carbon throughout, and which has a defect density of less than about 10$^7$ cm$^{-2}$. In addition, a major surface may have a relatively smooth surface with a surface roughness of less than about 5 nm RMS. The free-standing GaN wafer may have a diameter of greater than about 50 mm, and a thickness of greater than about 100 microns.

Another aspect of the invention relates to a method for making an electronic device, such as a light-emitting device, for example. The method preferably includes providing a (1$\bar{1}$00)-oriented, single crystal gallium nitride (GaN) layer being devoid of carbon and having a defect density of less than about 10$^7$ cm$^{-2}$; forming at least one doped semiconductor layer adjacent the (1$\bar{1}$00)-oriented, single crystal GaN layer; and forming at least one contact to the at least one doped semiconductor layer. A major surfaces of the (1$\bar{1}$00)-oriented, single crystal GaN layer may have a surface roughness of less than about 5 nm RMS. The (1$\bar{1}$00)-oriented, single crystal GaN layer may also have a thickness of greater than about 100 microns.

Still another aspect of the invention relates to an electronic device, such as a light-emitting device, for example. The electronic device preferably includes a (1$\bar{1}$00)-oriented, single crystal gallium nitride (GaN) layer being devoid of carbon throughout and having a defect density of less than about 10$^7$ cm$^{-2}$; at least one doped semiconductor layer adjacent the (1$\bar{1}$00)-oriented, single crystal GaN layer; and at least one contact to the at least one doped semiconductor layer.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The appearance of regions and layers is not to scale and may be exaggerated for clarity of explanation.

Figure 1:
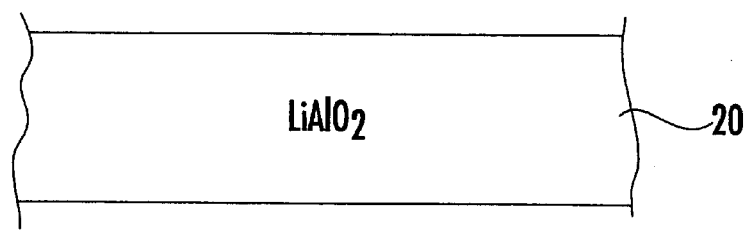
FIGS. 1 through 3 are schematic cross-sectional views illustrating forming of a GaN layer on an LiAlO$_2$ substrate in accordance with the present invention.

Referring initially to FIGS. 1–7 the present invention is first explained. FIGS. 1 though 6 illustrate intermediate structures during manufacture, while the flow chart of FIG. 7 sets forth the corresponding process steps. Accordingly, reference will be made to both the intermediate structures and the method steps in the following description for clarity. From the start (Block 42), an LiAlO$_2$ substrate 20 (FIG. 1) is provided, and the substrate may be cleaned at Block 44. After cleaning, the LiAlO$_2$ substrate 20 is placed in a deposition chamber or reactor, not shown, which provides the controlled conditions for growth of the GaN layer 24 as will be readily appreciated by those skilled in the art.

Figure 2:
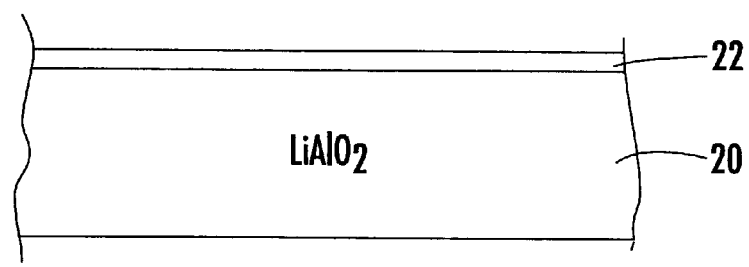

At Block 46, the substrate 20 may be pretreated to form a gallium monolayer 22 thereon as shown in FIG. 2. It is theorized by applicants, without their wishing to be bound thereto, that the monolayer 22 comprises Ga and some halide, and that this monolayer improves the subsequent growth of GaN. It is believed that the halide is substantially removed during the subsequent deposition step. The pretreating (Block 46) may use a gallium halide reactant gas, such as GaCl, without the nitrogen-containing reactant gas, such as NH3. This is in contrast to a number of prior art approaches, such as U.S. Pat. No. 6,218,280, which suggest the desirability of first nitriding the surface of the substrate. U.S. Pat. No. 6,139,628 also discloses the desirability of forming an initial growth layer of gallium nitride which is performed at a lower temperature prior to deposition of the GaN layer.

Of course, the pretreating (Block 46) may be performed for a time sufficient to form the gallium monolayer 22 on the single crystal LiAlO$_2$ substrate 20. For example, the pretreating (Block 46) may be carried out for about 30 seconds to 2 minutes. It is also theorized that the pretreating (Block 46) may not be needed for all applications.

Figure 3:
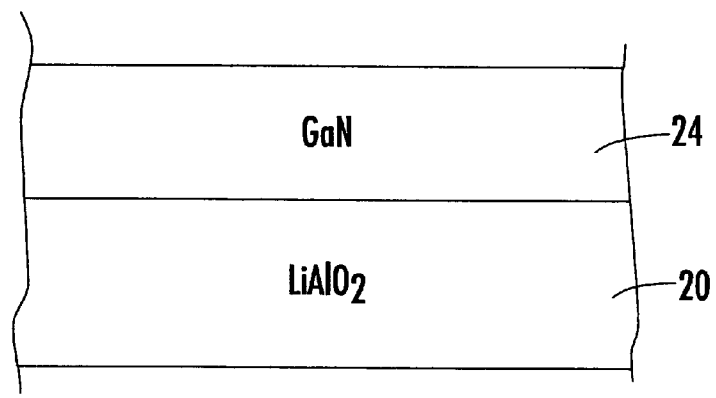
Figure 4:
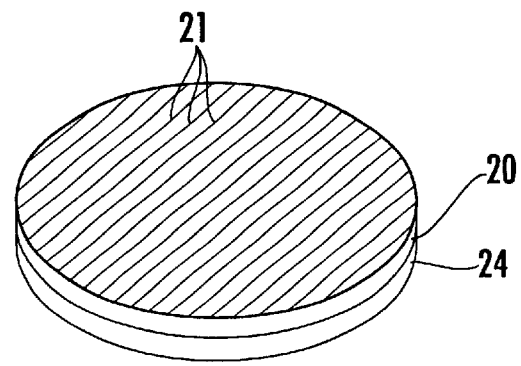
FIG. 4 is a schematic perspective view of the intermediate GaN product as shown in FIG. 3, with the LiAlO$_2$ substrate being shown on top.
Figure 7:
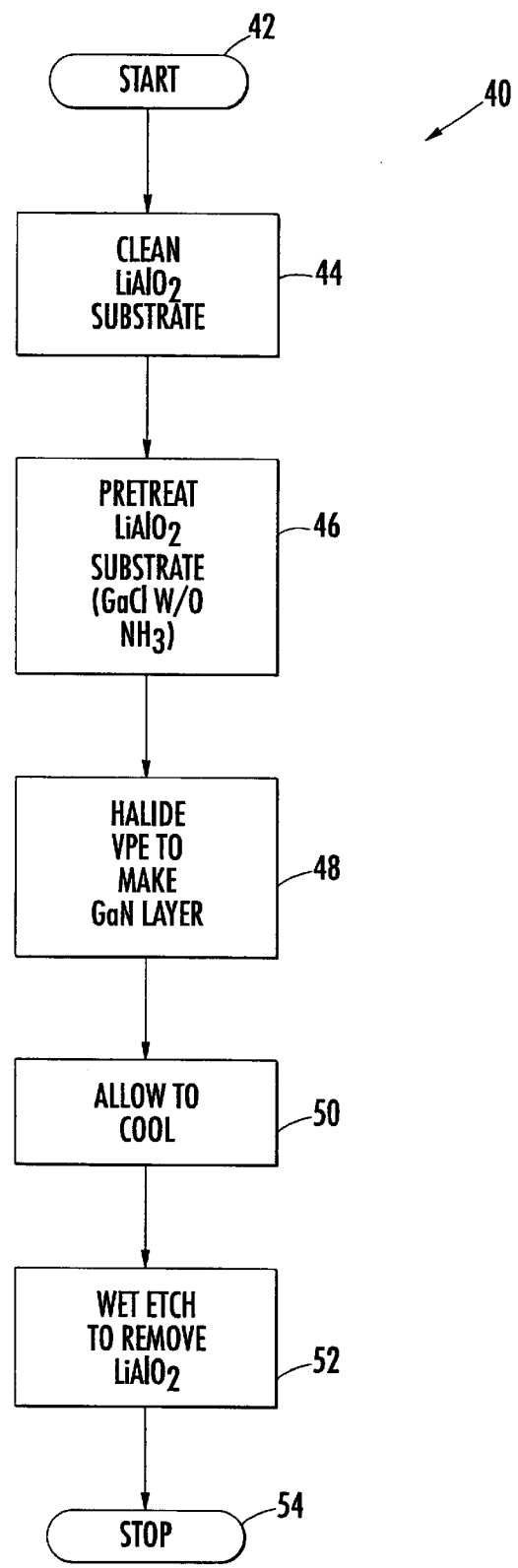
FIG. 7 is a flow chart of the steps for making the free-standing GaN wafer in accordance with the invention.

As shown in FIG. 3 and indicated at Block 48 of the flow chart 40 of FIG. 7, the GaN layer 24 may be grown on the pretreated substrate 20. This growth may be conveniently carried out in the same reactor or deposition chamber as was the pretreating. The single crystal GaN layer 24 may be deposited by vapor phase epitaxy (VPE) using the gallium halide reactant gas and a nitrogen-containing reactant gas. The optional pretreating (Block 46) and depositing by halide VPE (Block 48) may be considered as forming the single crystal GaN layer 24.

The gallium halide reactant gas may comprise gallium chloride, and the nitrogen-containing reactant gas may comprise ammonia, for example. Other gallium halide gasses may be used as will be appreciated by those skilled in the art. In addition, other nitrogen-containing gasses other than NH$_3$ may also be used, although NH$_3$ is preferred for most applications. Both the pretreatment (Block 46) and halide VPE (Block 48) may be carried out at a temperature in a range of about 800 to 1100° C., and at a pressure of in a range of about 100 to 300 Torr.

At Block 50, the LiAlO$_2$ substrate 20 and GaN layer 24 are allowed to cool. Because the LiAlO$_2$ substrate is compliant, it does not bow as the GaN forms, as typically occurs when using a conventional sapphire substrate, for example. In addition, the LiAlO$_2$ substrate 20 will relieve stress due to the difference in thermal expansion coefficients by forming cracks, schematically illustrated by lines 21 in FIG. 4.

Figure 5:
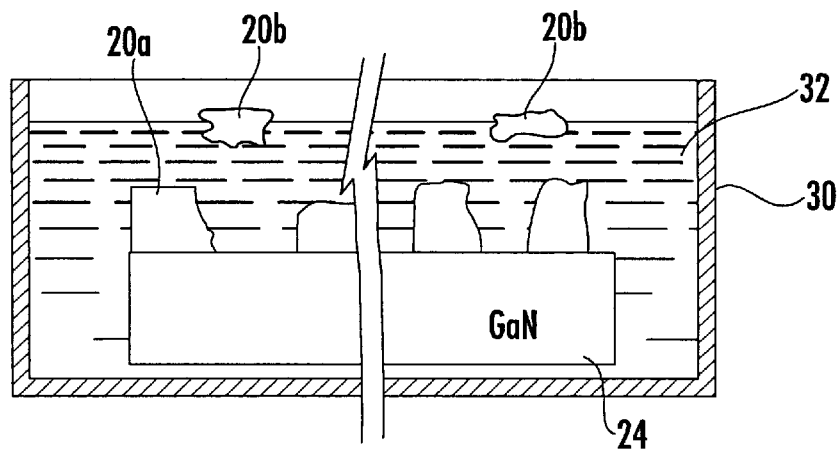
FIG. 5 is a schematic cross-sectional view of the intermediate GaN product illustrating wet etching of the LiAlO$_2$ substrate.
Figure 6:
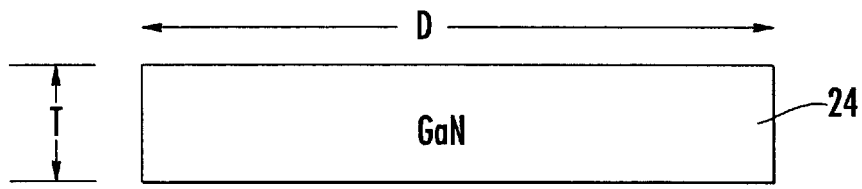
FIG. 6 is a schematic cross-sectional view of the free-standing, single crystal GaN wafer after the LiAlO$_2$ substrate is removed.

As shown in FIG. 5, the LiAlO$_2$ substrate 20 and GaN layer 24 may be wet etched (Block 52) to remove the substrate and leave a free-standing single crystal GaN layer 24 as shown in FIG. 6. As schematically shown in FIG. 5, the GaN layer 24 and LiAlO$_2$ substrate may be placed in an etchant 32, such as hydrochloric acid 32, in a suitable container. To increase the etch rate, the etchant 32 may be heated as will be appreciated by those skilled in the art. As shown in FIG. 5, during etching, some of the substrate portions 20b may separate first, leaving other substrate portions 20a still attached to the GaN layer 24. However, the substrate portions 20a will also be removed over time before stopping at Block 54, and leaving only the GaN layer 24 to thereby produce the free-standing, single crystal GaN wafer as shown in FIG. 6.

The single crystal GaN wafer 24 may advantageously be (1$\bar{1}$00)-oriented, single crystal GaN based upon growth using (100)-oriented tetragonal (γ) LiAlO$_2$ as the starting substrate 20. Those of skill in the art will appreciate that the term "(1$\bar{1}$00)-oriented" is the same as (10$\bar{1}$0), ($\bar{1}$100), ($\bar{1}$010), (01$\bar{1}$0), or (0$\bar{1}$10)-oriented in view of the hexagonal crystalline structure of the GaN. For simplicity and clarity of explanation, only the designation (1$\bar{1}$00)-oriented is used elsewhere herein. Such a (1$\bar{1}$00)-oriented GaN wafer 24 offers advantages in terms of efficiency and producing UV spectrum light emitting devices as will be appreciated by those skilled in the art.

One aspect of the invention is thus directed to a method for making the free-standing, single crystal, GaN wafer 24 comprising forming a single crystal GaN layer 24 directly on a single crystal LiAlO$_2$ substrate 20 using a gallium halide reactant gas, and removing the single crystal LiAlO$_2$ substrate from the single crystal GaN layer. Because gallium halide is used as a reactant gas rather than a metal organic reactant such as trimethygallium (TMG), the growth of the GaN layer 24 can be performed using VPE which provides commercially acceptable rapid growth rates.

The GaN layer 24 is also devoid of carbon throughout. Also, because the GaN layer 24 produced is high quality single crystal, its upper major surface opposite the LiAlO$_2$ substrate 20 is relatively smooth and does not typically need a smoothing capping layer, such as also typically formed using a metalorganic reactant, such as TMG. The upper major surface opposite the substrate 20 may have a surface roughness of less than about 5 nm RMS. In addition, the free-standing GaN wafer 24 may have a diameter (D) of greater than about 50 mm, and a thickness (T) of greater than about 100 microns.

Figure 8:
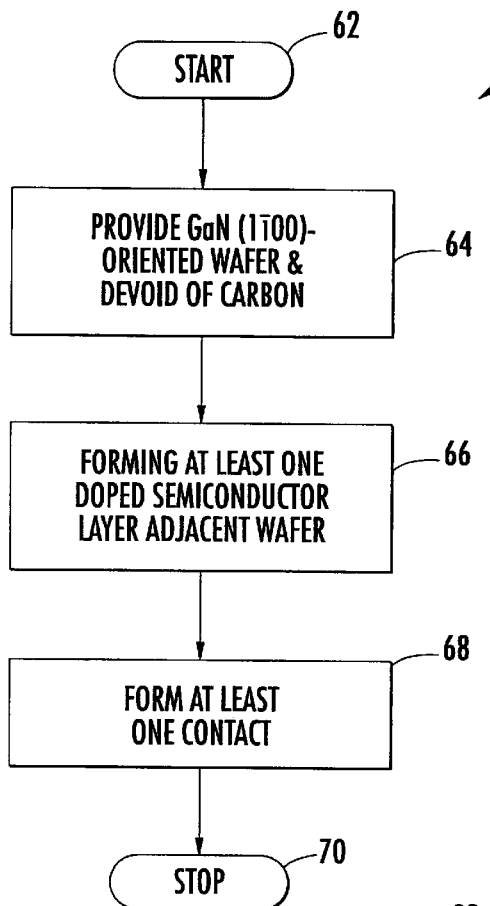
FIG. 8 is a flow chart of the steps for making an electronic device using the single crystal GaN wafer in accordance with the invention.
Figure 9:
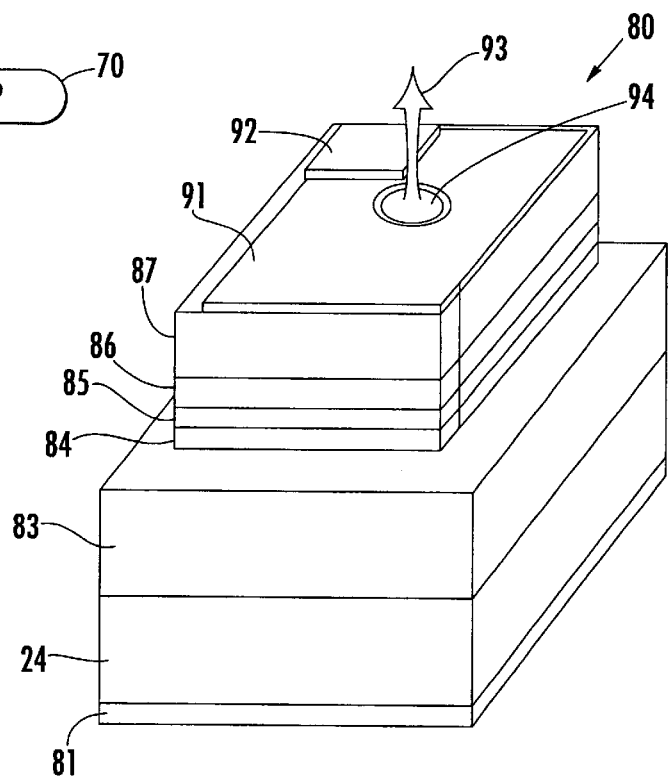
FIG. 9 is a schematic perspective view of an electronic device using the single crystal GaN wafer in accordance with the invention.

Turning now additionally to the flow chart 60 of FIG. 8 and the exemplary electronic device 80 of FIG. 9 other aspects of the invention are now described in further detail. In particular, the GaN wafer 24 as described above may be used to form electronic devices, particularly, light-emitting devices producing wavelengths in the ultraviolet region. From the start (Block 62), the method for making such an electronic device may include providing a (1$\bar{1}$00)-oriented, single crystal GaN layer 24 being devoid of carbon throughout and having a defect density of less than about $10^7$ cm$^{-2}$. The method also illustratively includes forming at least one doped semiconductor layer adjacent the (1$\bar{1}$00)-oriented, single crystal GaN layer, such as by VPE (Block 66) or other deposition techniques as will be appreciated by those skilled in the art. Thereafter, at Block 68 at least one contact may be formed to the at least one doped semiconductor layer. The at least one doped semiconductor layer may comprise a compound of AlGaInN, for example.

As described above, the upper major surface of the (1$\bar{1}$00)-oriented, single crystal GaN layer 24 may have a surface roughness of less than about 5 nm RMS. The (1$\bar{1}$00)-oriented, single crystal GaN layer 24 may also have a thickness (T) of greater than about 100 microns.

Accordingly, still another aspect of the invention relates to an electronic device, such as a light-emitting device, for example. The electronic device may be broadly considered as including the (1$\bar{1}$00)-oriented, single crystal GaN layer 24 being devoid of carbon throughout and having a defect density of less than about $10^7$ cm$^{-2}$; at least one doped semiconductor layer adjacent the (1$\bar{1}$00)-oriented, single crystal GaN layer; and at least one contact to the at least one doped semiconductor layer.

A representative light-emitting device 80 is now described with specific reference to FIG. 9. The device 80 illustratively includes an aluminum electrode layer 81 on the lower surface of the single crystal GaN layer 24. The aluminum layer 81 may have a thickness on the order of 150 nm. On the upper surface of the GaN layer 24 is an n-type Si:GaN epitaxial layer 83, which may have a thickness of about 1000 nm.

Stacked on the n-type GaN layer 83 are a series of additional semiconductor layers 84–87. For example, these layers illustratively include, an Si:AlGaN n-type layer 84 of about 150 nm thickness, an InGaN active layer 85 of about 50 nm, an Mg:AlGaN p-type layer 86 of about 150 nm, and an Mg:GaN p-type layer 87 of about 500 nm. An Ni—Au contact layer 91 is illustratively on the semiconductor layer stack 84–87. A p-electrode bonding pad 92 is provided on the Ni—Au layer 91. An opening 94 through the Ni—Au layer 91 permits light 93 to be emitted from the device 80 as will be appreciated by those skilled in the art.

As will also be appreciated by those skilled in the art, other electronic devices, including those that emit light and those that do not, may also beneficially be made using the GaN wafer 24 as described herein.

EXAMPLES

The following examples are provided for further explanation, but are not intended to be limitative of the present invention.

A 40 mm diameter wafer of LiAlO$_2$ was placed in a beaker containing 12N hydrochloric acid and heated for one hour at 150° F. on a hot plate. It was then removed from the acid, and rinsed with distilled water, isopropyl alcohol, and acetone. It was dried in a vacuum oven at 200° C. for 30 min. The wafer was placed on a SiC coated graphite susceptor, containing a 52 mm pocket. The susceptor plus the wafer were transferred into the deposition section of the reaction chamber. The reaction chamber was a horizontal quartz tube with a 100 mm outer diameter and a 95 mm inner diameter. Nitrogen gas flow was started. The furnace was turned on, and the wafer was heated up.

The reactor was similar to the traditional RCA Corporation design for Halide Vapor Phase Epitaxy (HVPE) reactors. There are three zones in the furnace, zone 1 is the deposition zone, zone 2 is the center zone, and zone 3 is the halide generation zone. Zone 1 is 203 mm long, zone 2 is 152 mm long, and zone 3 is 203 mm long. These zones are resistance heated. A quartz boat, 32 mm in diameter and 150 mm long was placed in zone 3. The boat was filled with liquid gallium metal. The gallium boat was located within an inner quartz tube with a 38 mm diameter, coaxial with the growth chamber tube. During operation, hydrogen always flowed over the gallium boat to maintain a reducing atmosphere. During growth, anhydrous hydrogen chloride was also passed over the gallium metal, which generated GaCl when zone 3 was maintained at an elevated temperature. In the reactor, the generation efficiency was about 95% when the zone 3 temperature was 850° C. The halide generation tube ends as a spout located 25 mm before the position of the edge of the SiC-coated graphite susceptor.

The axial center of the SiC-coated graphite susceptor is located at the junction between zone 1 and zone 2. The susceptor was rotated during a growth run, giving the entire piece the average temperature that was maintained at the junction between the two furnace zones. Halide vapor phase epitaxy is a near equilibrium growth process. Therefore, the center zone was maintained at the highest temperature, while the deposition zone was at a lower temperature. The resulting temperature gradient drove the following reversible reaction, to the right:

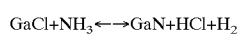
GaCl+NH$_3$←→GaN+HCl+H$_2$

The system pressure was set at 200 Torr. The wafer was rotated at 60 rpm. The furnaces were set at zone 1=960° C., zone 2=1050° C., and zone 3=850° C. The sample temperature was 1010° C. The ammonia flow rate was set at 3000 mL/min. The hydrogen flow rate was set at 100 mL/min. The HCl flow rate was set at 20 mL/min. The total flow of nitrogen carrier gas was 10,000 mL/min.

In one example, the LiAlO$_2$ substrate was placed on the susceptor rotator in the growth furnace at ambient temperature, after which the furnace was turned on and the sample was brought up to temperature in situ. The time to arrive at a growth temperature of about 1000° C. was about 3 hours. Alternatively, the furnace can already be set at an elevated temperature, preferably 800° C., when the substrate is inserted. This allows a time for annealing. The annealing time was about 30 min. Finally, the wafer may be inserted into the growth zone when the furnace has reached the desired temperature. In any case, hydrogen was always flowing over the gallium boat to preserve a reducing environment.

When the substrate arrived at the desired growth temperature, the flow of HCl was started. Thus GaCl was transported to the surface of the LiAlO$_2$ substrate, and became adsorbed. As noted above, it is theorized that gallium atoms are adsorbed onto the surface, and chlorine atoms may be yet bonded to each gallium, but face away from the surface. This condition was allowed to remain from 30 to 60 seconds. Then the flow of ammonia was started. The NH$_3$ molecules landed on the surface, the nitrogen formed bonds with the surface monolayer of gallium, and HCl was vaporized from the surface.

Under these conditions, the growth rate of GaN was about 50 microns per hour. GaN layers up to 0.15 mm thick have been grown. The layers are transparent and have mirror smooth surfaces. The GaN crystals deposited on (100) LiAlO$_2$ exhibit the (1$\bar{1}$00) orientation.

The LiAlO$_2$ substrate is very soft or compliant compared with GaN. Upon cooling to room temperature, it develops stress lines. LiAlO$_2$ is a compliant substrate because it relieves the stress due to different rates of thermal compression by fracturing, rather than by bowing the GaN. The finished sample was placed in a 50:50 mixture of distilled water and 12 N HCl for 1 hour at 210° F. All of the LiAlO$_2$ dissolved away, leaving a free standing GaN wafer with a 40 mm diameter.

Figure 10:
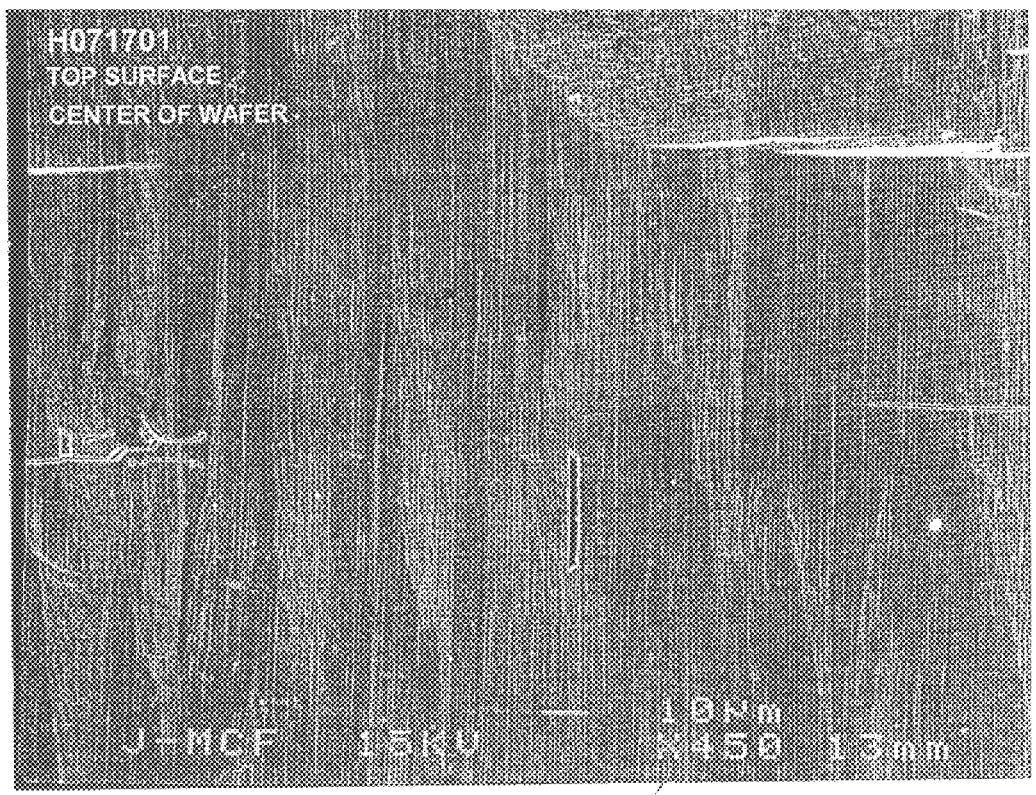
FIG. 10 is an SEM micrograph of a surface of a GaN wafer in accordance with the present invention.
Figure 11:
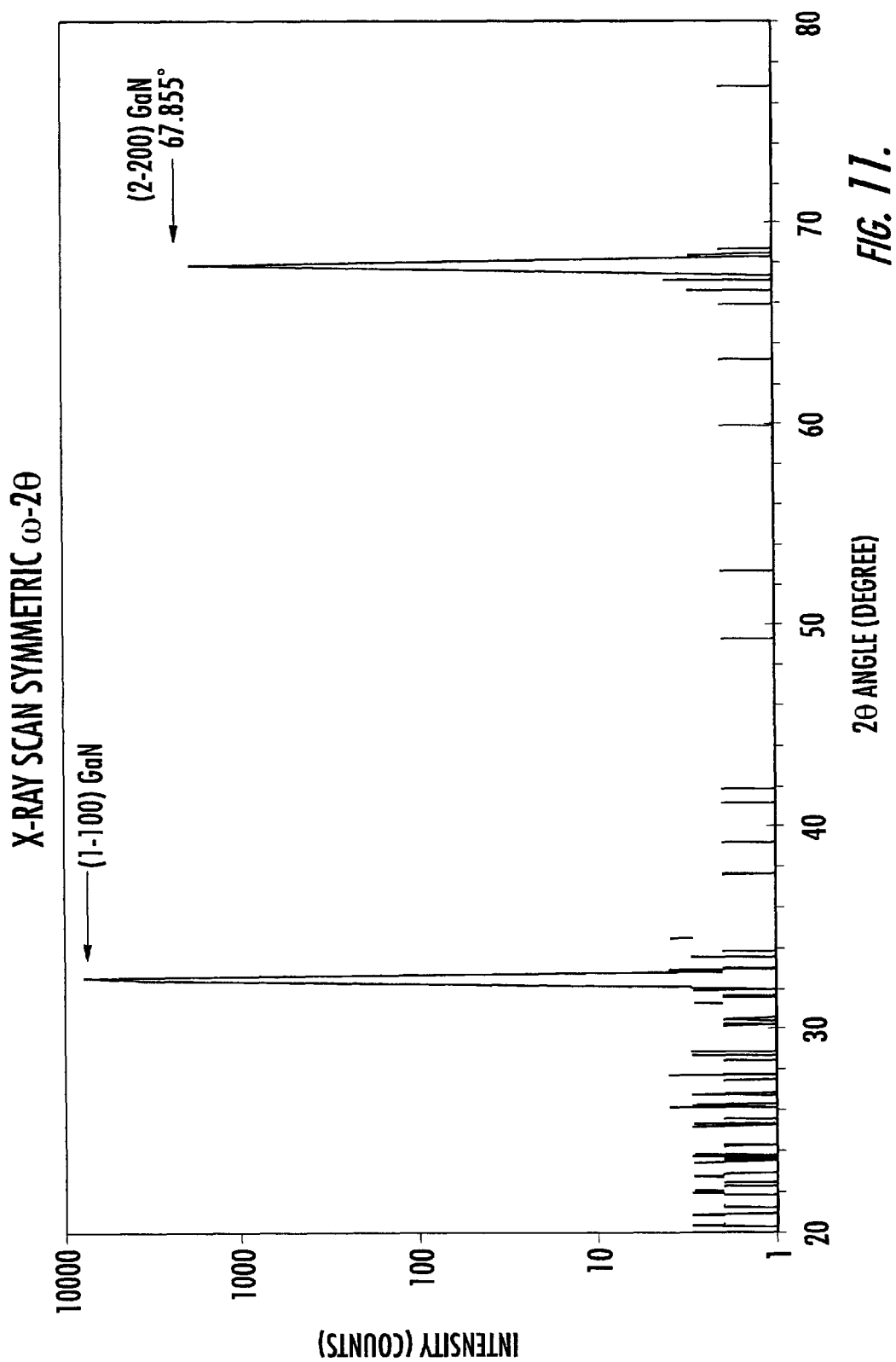
FIG. 11 is an x-ray scanning plot of a GaN wafer in accordance with the invention.

A photomicrograph of the top surface of the center of a GaN wafer 24 produced in accordance with the example is shown in FIG. 10. The scanning electron microscope photomicrograph reveals the surface as high quality, single crystal material. The x-ray data plotted in FIG. 11 further confirms that the GaN wafer was (1$\bar{1}$00)-oriented. In other words, that the c-axis was in the plane of the wafer.

Other samples were also prepared with the following parameters. Temperatures were set as follows: zone 1=910° C., zone 2=1000° C., zone 3=850° C., thereby producing a growth temperature=960° C. The flow rate of NH$_3$=2000 mL/min was used, and the flow rate of NH$_3$=1000 mL/min was also used. The system pressure was in range from 100 to 300 Torr. The flow rate of HCl was in a range from 10 to 40 mL/min. and the growth rate was found to be directly proportional to this flow rate. The rotation speed was in range from 20 to 120 rpm. In addition, a larger LiAlO$_2$ substrate of a 50.8 mm diameter was also used.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a free-standing, single crystal, gallium nitride (GaN) wafer comprising:
   providing a single crystal lithium aluminate (LiAlO$_2$) substrate;
   forming a single crystal GaN layer directly on the single crystal LiAlO$_2$ substrate using a gallium halide reactant gas; and
   removing the single crystal LiAlO$_2$ substrate from the single crystal GaN layer to make the free-standing, single crystal GaN wafer.

2. A method according to claim 1 wherein forming the single crystal GaN layer comprises depositing GaN by vapor phase epitaxy (VPE) using the gallium halide inorganic reactant gas and a nitrogen-containing reactant gas.

3. A method according to claim 2 wherein the gallium halide reactant gas comprises gallium chloride.

4. A method according to claim 2 wherein the nitrogen-containing reactant gas comprises ammonia.

5. A method according to claim 2 further comprising pretreating the single crystal LiAlO$_2$ substrate prior to depositing GaN using the gallium halide reactant gas without the nitrogen-containing reactant gas.

6. A method according to claim 5 wherein the pretreating is performed for a time sufficient to form a monolayer of gallium on the single crystal LiAlO$_2$ substrate.

7. A method according to claim 5 wherein the pretreating and depositing are performed in the same chamber.

8. A method according to claim 1 wherein the single crystal LiAlO$_2$ substrate comprises tetragonal LiAlO$_2$.

9. A method according to claim 8 wherein the tetragonal LiAlO$_2$ is (100)-oriented so that the single crystal GaN layer is a (1$\bar{1}$00)-oriented GaN layer.

10. A method according to claim 1 wherein the forming is performed at an elevated temperature, and the single crystal LiAlO$_2$ substrate and the single crystal GaN layer have relative thicknesses so that the single crystal LiAlO$_2$ substrate is compliant and develops cracks therein upon cooling from the elevated temperature.

11. A method according to claim 1 wherein separating comprises wet etching the single crystal LiAlO$_2$ substrate away from the single crystal GaN layer.

12. A method according to claim 11 wherein wet etching comprises wet etching using hydrochloric acid at a temperature above room temperature.

13. A method according to claim 1 wherein the single crystal GaN layer has a defect density of less than about $10^7$ cm$^{-2}$.

14. A method according to claim 1 wherein the single crystal LiAlO$_2$ substrate has a diameter of at least about 50 mm.

15. A method according to claim 1 wherein the single crystal LiAlO$_2$ substrate has a thickness of less than about 500 $\mu$m.

16. A method according to claim 1 wherein the single crystal GaN layer has a thickness of greater than about 100 $\mu$m.

17. A method according to claim 1 further comprising cleaning the single crystal LiAlO$_2$ substrate before forming the single crystal GaN layer.

18. A method for making a free-standing, (1$\bar{1}$00)-oriented, single crystal, gallium nitride (GaN) wafer comprising:
   providing a (100)-oriented, single crystal, tetragonal ($\gamma$) lithium aluminate (LiAlO$_2$) substrate;
   forming a (1$\bar{1}$00)-oriented, single crystal, GaN layer directly on the (100)-oriented, single crystal, $\gamma$-LiAlO$_2$ substrate using a gallium halide reactant gas to a thickness of greater than about 100 $\mu$m; and
   removing the (100)-oriented, single crystal, $\gamma$-LiAlO$_2$ substrate from the (1$\bar{1}$00)-oriented, single crystal GaN layer to make the free-standing, (1$\bar{1}$00)-oriented GaN wafer.

19. A method according to claim 18 wherein forming the (1$\bar{1}$00)-oriented, single crystal, GaN layer comprises depositing GaN by vapor phase epitaxy (VPE) using the gallium halide reactant gas and a nitrogen-containing reactant gas.

20. A method according to claim 19 wherein the gallium halide reactant gas comprises gallium chloride; and wherein the nitrogen-containing reactant gas comprises ammonia.

21. A method according to claim 19 further comprising pretreating the (100)-oriented, single crystal, $\gamma$-LiAlO$_2$ substrate prior to depositing GaN using the gallium halide reactant gas without the nitrogen-containing reactant gas.

22. A method according to claim 21 wherein the pretreating is performed for a time sufficient to form a monolayer of gallium on the (100)-oriented, single crystal, γ-LiAlO$_2$ substrate.

23. A method according to claim 18 wherein the forming is performed at an elevated temperature, and the (100)-oriented γ-LiAlO$_2$ substrate and the (1$\bar{1}$00)-oriented, single crystal, GaN layer have relative thicknesses so that the (100)-oriented γ-LiAlO$_2$ substrate is compliant and develops cracks therein upon cooling from the elevated temperature.

24. A method according to claim 18 wherein the (1$\bar{1}$00)-oriented, single crystal GaN layer has a defect density of less than about 10$^7$ cm$^{-2}$.

25. A method according to claim 17 wherein the (100)-oriented, single crystal, γ-LiAlO$_2$ substrate has a diameter of at least about 50 mm and a thickness of less than about 500 μm; and wherein the (1$\bar{1}$00)-oriented, single crystal, GaN layer has a thickness of greater than about 100 μm.

26. A method for making a free-standing, single crystal, gallium nitride (GaN) wafer comprising:
   providing a single crystal lithium aluminate (LiAlO$_2$) substrate;
   pretreating the single crystal LiAlO$_2$ substrate with a gallium halide reactant gas in an environment devoid of a reactive nitrogen gas;
   depositing GaN directly on the pretreated LiAlO$_2$ substrate by vapor phase epitaxy (VPE) using the gallium halide reactant gas and ammonia to form a single crystal GaN layer; and
   removing the single crystal LiAlO$_2$ substrate from the single crystal GaN layer to make the free-standing, single crystal GaN wafer.

27. A method according to claim 26 wherein the gallium halide reactant gas comprises gallium chloride.

28. A method according to claim 26 wherein the pretreating is performed for a time sufficient to form a monolayer of gallium on the single crystal LiAlO$_2$ substrate.

29. A method according to claim 26 wherein the pretreating and depositing are performed in the same chamber.

30. A method according to claim 26 wherein the single crystal LiAlO$_2$ substrate comprises tetragonal LiAlO$_2$.

31. A method according to claim 30 wherein the tetragonal LiAlO$_2$ is (100)-oriented so that the single crystal GaN layer is a (1$\bar{1}$00)-oriented GaN layer.

32. A method according to claim 26 wherein the forming is performed at an elevated temperature, and the single crystal LiAlO$_2$ substrate and the single crystal GaN layer have relative thicknesses so that the single crystal LiAlO$_2$ substrate is compliant and develops cracks therein upon cooling from the elevated temperature.

33. A method according to claim 26 wherein separating comprises wet etching the single crystal LiAlO$_2$ substrate away from the single crystal GaN layer.

34. A method according to claim 26 wherein the single crystal GaN layer has a defect density of less than about 10$^7$ cm$^{-2}$.

35. A method according to claim 26 wherein the single crystal LiAlO$_2$ substrate has a diameter of at least about 50 mm and a thickness of less than about 500 μm; and wherein the single crystal GaN layer has a thickness of greater than about 100 μm.

36. A method according to claim 24 further comprising cleaning the single crystal LiAlO$_2$ substrate before forming the single crystal GaN layer.

37. A method for making a free-standing, single crystal, gallium nitride (GaN) wafer devoid of carbon, the method comprising:
   providing a single crystal lithium aluminate (LiAlO$_2$) substrate;
   forming a single crystal GaN layer devoid of carbon directly on the single crystal LiAlO$_2$ substrate; and
   removing the single crystal LiAlO$_2$ substrate from the single crystal GaN layer to make the free-standing, single crystal GaN wafer devoid of carbon.

38. A method according to claim 37 wherein forming the single crystal GaN layer devoid of carbon comprises depositing GaN by vapor phase epitaxy (VPE) using a gallium halide inorganic reactant gas and a nitrogen-containing reactant gas.

39. A method according to claim 38 wherein the gallium halide reactant gas comprises gallium chloride; and wherein the nitrogen-containing reactant gas comprises ammonia.

40. A method according to claim 37 further comprising pretreating the single crystal LiAlO$_2$ substrate prior to depositing GaN using the gallium halide reactant gas without the nitrogen-containing reactant gas.

41. A method according to claim 40 wherein the pretreating is performed for a time sufficient to form a monolayer of gallium on the single crystal LiAlO$_2$ substrate.

42. A method according to claim 40 wherein the pretreating and depositing are performed in the same chamber.

43. A method according to claim 37 wherein the single crystal LiAlO$_2$ substrate comprises (100)-oriented, tetragonal LiAlO$_2$ so that the single crystal GaN layer devoid of carbon is a (1$\bar{1}$00)-oriented GaN layer devoid of carbon.

44. A method according to claim 37 wherein the forming is performed at an elevated temperature, and the single crystal LiAlO$_2$ substrate and the single crystal GaN layer devoid of carbon have relative thicknesses so that the single crystal LiAlO$_2$ substrate is compliant and develops cracks therein upon cooling from the elevated temperature.

45. A method according to claim 37 wherein the single crystal GaN layer devoid of carbon has a defect density of less than about 10$^7$ cm$^{-2}$.

46. A method according to claim 37 wherein the single crystal LiAlO$_2$ substrate has a diameter of at least about 50 mm and a thickness of less than about 500 μm; and wherein the single crystal GaN layer devoid of carbon has a thickness of greater than about 100 μm.

47. A free-standing wafer comprising (1$\bar{1}$00)-oriented, single crystal gallium nitride (GaN) being devoid of carbon throughout and having a defect density of less than about 10$^7$ cm$^{-2}$.

48. A free-standing wafer according to claim 47 wherein at least one major surface thereof has an RMS surface roughness of less than about 5 nm.

49. A free-standing wafer according to claim 47 having a diameter of greater than about 50 mm.

50. A free-standing wafer according to claim 47 having a thickness of greater than about 100 microns.

51. A free-standing wafer comprising (1$\bar{1}$00)-oriented, single crystal gallium nitride (GaN) being devoid of carbon throughout and having a defect density of less than about 10$^7$ cm$^{-2}$ and a thickness greater than about 100 microns, and a diameter of greater than about 50 mm.

52. A free-standing wafer according to claim 51 wherein at least one major surface thereof has an RMS surface roughness of less than about 5 nm.

53. A method for making an electronic device comprising:
   providing a (1$\bar{1}$00)-oriented, single crystal gallium nitride (GaN) layer being devoid of carbon throughout and having a defect density of less than about 10$^7$ cm$^{-2}$;
   forming at least one doped semiconductor layer adjacent said (1$\bar{1}$00)-oriented, single crystal GaN layer; and forming at least one contact to said at least one doped semiconductor layer.

54. A method according to claim 53 wherein said at least one doped semiconductor layer comprise a compound of AlGaInN.

55. A method according to claim 53 wherein a surface of said (1$\bar{1}$00)-oriented, single crystal GaN layer adjacent said at least one doped semiconductor layer has an RMS surface roughness of less than about 5 nm.

56. A method according to claim 53 wherein said (1$\bar{1}$00)-oriented, single crystal GaN layer has a thickness of greater than about 100 microns.

57. A method according to claim 53 wherein the electronic device comprises a light-emitting device.

58. An electronic device comprising:
 a (1$\bar{1}$00)-oriented, single crystal gallium nitride (GaN) layer being devoid of carbon adjacent at least both of the major opposing surfaces having a defect density of less than about $10^7$ cm$^{-2}$;
 at least one doped semiconductor layer adjacent said (1$\bar{1}$00)-oriented, single crystal GaN layer; and
 at least one contact to said at least one doped semiconductor layer.

59. An electronic device according to claim 58 wherein said at least one doped semiconductor layer comprise a compound of AlGaInN.

60. An electronic device according to claim 58 wherein a surface of said (1$\bar{1}$00)-oriented, single crystal GaN layer adjacent said at least one doped semiconductor layer has an RMS surface roughness of less than about 5 nm.

61. An electronic device according to claim 58 wherein said (1$\bar{1}$00)-oriented, single crystal GaN layer has a thickness of greater than about 100 microns.

62. An electronic device according to claim 58 wherein the electronic device comprises a light-emitting device.

* * * * *

UNITED STATES PATENT AND TRADEMARK OFFICE
CERTIFICATE OF CORRECTION

PATENT NO. : 6,648,966 B2 Page 1 of 1
APPLICATION NO. : 09/920448
DATED : November 18, 2003
INVENTOR(S) : Herbert Paul Maruska, John Joseph Gallagher and Mitch M.C. Chou It is certified that error appears in the above-identified patent and that said Letters Patent is hereby corrected as shown below:

Cover page (54)   Delete: "WAFER PRODUCED THEREBY, AND ASSOCIATED METHODS AND DEVICES USING THE WAFER"

Insert: --METHOD FOR MAKING FREE-STANDING GaN WAFER, WAFER PRODUCED THEREBY, AND ASSOCIATED MTEHODS AND DEVICES USING THE WAFER --

Column 1, Line 1   Delete: "WAFER PRODUCED THEREBY, AND ASSOCIATED METHODS AND DEVICES USING THE WAFER"

Insert: --METHOD FOR MAKING FREE-STANDING GaN WAFER, WAFER PRODUCED THEREBY, AND ASSOCIATED MTEHODS AND DEVICES USING THE WAFER --

Signed and Sealed this

Sixth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 6,648,966 B2  Page 1 of 1
APPLICATION NO. : 09/920448
DATED : November 18, 2003
INVENTOR(S) : Herbert Paul Maruska, John Joseph Gallagher and Mitch M. C. Chou It is certified that error appears in the above-identified patent and that said Letters Patent is hereby corrected as shown below:

On the Title Page Item (54) and Col. 1 lines 1-3

Delete: "WAFER PRODUCED THEREBY, AND ASSOCIATED METHODS AND DEVICES USING THE WAFER"

Insert: -- METHOD FOR MAKING FREE-STANDING GaN WAFER, WAFER PRODUCED THEREBY, AND ASSOCIATED METHODS AND DEVICES USING THE WAFER --

Signed and Sealed this

Twentieth Day of July, 2010

David J. Kappos
*Director of the United States Patent and Trademark Office*